US008604552B2

(12) United States Patent
Owada et al.

(10) Patent No.: US 8,604,552 B2
(45) Date of Patent: Dec. 10, 2013

(54) SEMICONDUCTOR DEVICE AND METHOD FOR FABRICATING SEMICONDUCTOR DEVICE

(75) Inventors: Tamotsu Owada, Kawasaki (JP); Hirofumi Watatani, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 541 days.

(21) Appl. No.: 12/567,972

(22) Filed: Sep. 28, 2009

(65) Prior Publication Data

US 2010/0012991 A1 Jan. 21, 2010

Related U.S. Application Data

(63) Continuation of application No. PCT/JP2007/056369, filed on Mar. 27, 2007.

(51) Int. Cl.
*H01L 29/76* (2006.01)
*H01L 23/58* (2006.01)

(52) U.S. Cl.
USPC ........... 257/369; 257/371; 257/635; 257/637; 257/640

(58) Field of Classification Search
USPC ......... 257/288, 368, 371, 392, 635, 637, 640, 257/E29.255, 369
See application file for complete search history.

(56) References Cited

U.S. PATENT DOCUMENTS

| 6,287,951 B1 * | 9/2001 | Lucas et al. ................... 438/618 |
| 6,362,508 B1 * | 3/2002 | Rasovsky et al. ............ 257/369 |
| 6,982,465 B2 | 1/2006 | Kumagai et al. |
| 7,704,816 B2 | 4/2010 | Huh et al. |
| 2004/0075139 A1 | 4/2004 | Takehiro |
| 2006/0006420 A1 * | 1/2006 | Goto .............................. 257/204 |
| 2006/0216950 A1 | 9/2006 | Matsuura |
| 2006/0269693 A1 | 11/2006 | Balseanu et al. |
| 2007/0249069 A1 * | 10/2007 | Alvarez et al. .................. 438/14 |
| 2008/0138983 A1 * | 6/2008 | Lien et al. ...................... 438/680 |
| 2008/0173908 A1 * | 7/2008 | Junker et al. ................... 257/288 |

FOREIGN PATENT DOCUMENTS

| JP | 2004-140274 A | 5/2004 |
| JP | 2005-057301 A | 3/2005 |
| JP | 2006-024784 A | 1/2006 |
| JP | 2006-303431 A | 11/2006 |
| WO | 2005/112127 A1 | 11/2005 |
| WO | 2006/055459 A2 | 5/2006 |
| WO | 2006/104583 A2 | 10/2006 |

OTHER PUBLICATIONS

International Search Report for PCT/JP2007/056369, mailing date of Jun. 26, 2007.
Japanese Office Action dated Aug. 21, 2012, issued in corresponding Japanese Patent Application 2009-506144, (8 pages). With Partial English Translation.
US Office Action dated Jun. 13, 2013, issued in related U.S. Appl. No. 12/598,010.

* cited by examiner

*Primary Examiner* — Michael Trinh

(74) *Attorney, Agent, or Firm* — Westerman, Hattori, Daniels & Adrian, LLP

(57) ABSTRACT

A method for fabricating a semiconductor device, comprising: forming n-channel field-effect transistors on a silicon substrate; forming a first insulating film covering the field-effect transistors; shrinking the first insulating film; forming a second insulating film over the first insulating film; and shrinking the second insulating film, wherein the forming an insulating film covering the field-effect transistors and the shrinking the insulating film are repeated a plurality of time.

8 Claims, 15 Drawing Sheets

US 8,604,552 B2

SEMICONDUCTOR DEVICE AND METHOD FOR FABRICATING SEMICONDUCTOR DEVICE

CROSS REFERENCE TO RELATED APPLICATION

This is a continuation of International Application No. PCT/JP2007/056369 filed on Mar. 27, 2007, the entire contents of which are incorporated herein by reference.

FIELD

The present invention relates to a semiconductor device having a stress film over field-effect transistors and a method for fabricating the semiconductor device.

BACKGROUND

In order to increase the performance of semiconductor devices, the structures of transistors have been miniaturized. However, it is becoming difficult to improve the speeds of operation of transistors only by miniaturization of the structures of transistors because the minimum feature sizes (for example the minimum gate lengths) that are now required have reached the order of the wavelength of light and driving voltage decreases with decreasing feature size.

Under these circumstances, it has generally found that the mobility of electrons (or holes) in silicon crystals is changed by applying a strain to the silicon crystals. The property is being widely used to improve the speeds of operation of transistors. For example, the carrier mobility of field-effect transistors is improved by applying a strain to silicon crystals in channel regions by stress films formed on a silicon substrate (Patent Document 1).

Patent Document 1 discloses that two types of stress films covering field-effect transistors are formed, which apply tensile stress and compressive stress on the silicon substrate. The two types of stress films apply tensile stress to the channel region of an n-channel transistor and compressive stress to the channel region of a p-type transistor.

Patent Document 1: Japanese Patent Laid-Open No. 2005-57301

Today, stress films that apply tensile stress to channel regions are provided by depositing a material such as a silicon nitride and then exposing the silicon nitride to ultraviolet (UV) light, for example. When the film deposited by the process is shrunk, the following problem may occur.

FIGS. 12 to 15 are cross-sectional views of a stress film formed by a conventional method. FIG. 12 is a cross-sectional view of a silicon nitride film deposited on n-channel transistors 10a, 10b by Chemical Vapor Deposition (CVD). FIG. 13 is a cross-sectional view of the silicon nitride film shrunk by UV exposure. FIGS. 14 and 15 are cross-sectional views of regions where p-channel transistors 20a, 20b are formed.

A surface may be formed in the silicon nitride film 60a formed as described above in a region between adjacent gate electrodes 15a, 15b where the portions of silicon nitride film 60a grown from the sidewalls of the adjacent gate electrodes join together (the surface will be referred to as discontinuous surface hereinafter). When subsequently the silicon nitride film 60a is shrunk by UV exposure, the silicon nitride film 60 at the discontinuous surface may break as shown in FIG. 13. If the silicon nitride film 60 breaks, stress may not be applied to the transistors. Portion A of the silicon nitride film 60 that was continuous when the silicon nitride film 60 was deposited also breaks because an impact caused when the discontinuous surface 4 in FIG. 12 was separated was applied to portion A. The impact caused when the discontinuous surface 4 was separated may propagate to the silicon substrate and may cause cracks on the surface of Shallow Trench Isolations (STIs) 2, for example.

Usually p-channel transistors are also formed on the same semiconductor substrate. The hole mobility of a p-channel transistor decreases when a tensile stress is applied to its channel region. Therefore, an additional step of selectively removing the tensile stress film formed over the entire semiconductor substrate is required. FIGS. 14 and 15 are cross-sectional views of a region where p-channel transistors 20a, 20b are formed. The silicon nitride film 60a deposited has overhangs between adjacent gate electrodes 25a and 25b and a void is formed between the electrodes. In this case, little silicon nitride film 60a is formed in portion B and therefore the overhangs and portion B are etched faster during the process of etching the silicon nitride film 60 away as shown in FIG. 15. Consequently, the surface of the silicon substrate 1 is damaged during the subsequent etching.

SUMMARY

According to one aspect of the embodiments, a method for fabricating a semiconductor device includes: forming n-channel field-effect transistors on a silicon substrate; forming a first insulating film covering the field-effect transistors; shrinking the first insulating film; forming a second insulating film over the first insulating film; and shrinking the second insulating film.

According to another aspect of the embodiments, a semiconductor device in which n-channel filed-effect transistors are formed on a silicon substrate, including: a first stress film formed to cover the field-effect transistors and applying a strain to channel regions of the field-effect transistors; and a second stress film formed on the first stress film and applying a strain to the channel regions of the field-effect transistors.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF EMBODIMENTS

Embodiments of the present invention will be described with reference to drawings. The present embodiments are only illustrative and the present invention is not limited to configurations shown in the embodiments.

Figure 1:
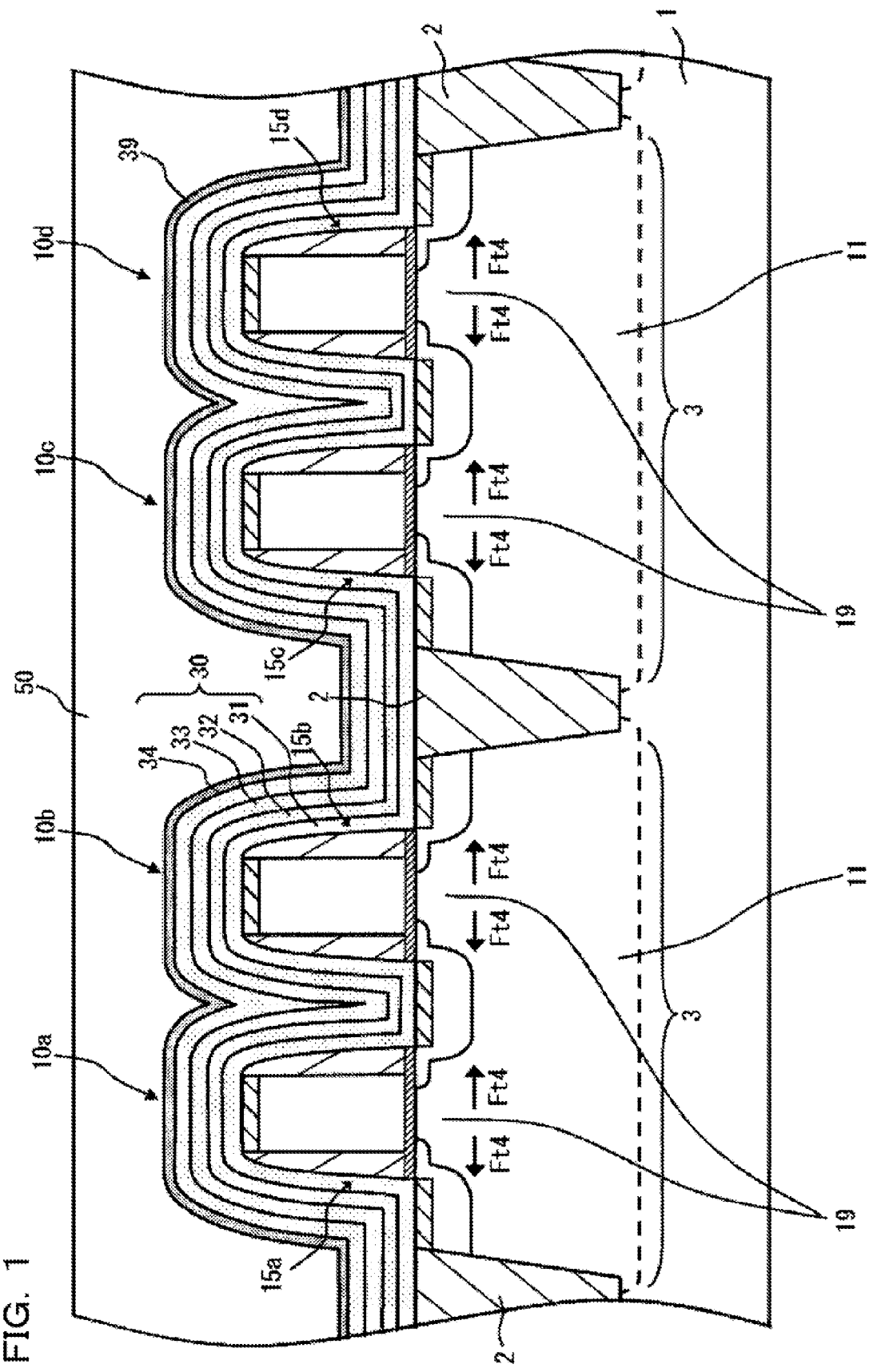
FIG. 1 schematically illustrates a structure of a semiconductor device according to a first exemplary embodiment.

FIG. 1 is a diagram schematically illustrating a structure of a semiconductor device according to a first exemplary embodiment. As illustrated in FIG. 1, a silicon substrate 1 is separated into a plurality of element formation regions 3 by Shallow Trench Isolations (STIs) 2. In each of the separate element formation regions 3, a well region 11 and an n-channel Metal Oxide Semiconductor (MOS) transistor 10a to 10d are formed. A stress film 30 is formed to cover the n-channel MOS transistors 10a to 10d. An interlayer insulating film 50 is formed on the stress film 30 by a method such as CVD or sputtering. The interlayer insulating film 50 may be made of a material such as a silicon oxide ($SiO_2$). An insulating film 39 which acts as an etch stopper is formed between the stress film 30 and the interlayer insulating film 50. The insulating film 39 may be a plasma TetraEthOxySilane (TEOS) film having a thickness of 25 nm, for example.

The stress film 30 includes layers of thin stress films deposited as shown in FIG. 1. In the present exemplary embodiment, the stress film 30 including four layers of thin stress films (first to fourth stress films 31 to 34), for example, is formed on electrodes 15a to 15d of the n-channel MOS transistors. While the stress film 30 may include any plural number of layers of thin stress films, it is desirable that the stress film 30 includes a minimum required number of layers in order to keep manufacturing cost low.

Process of Fabricating Semiconductor Device

A process of actually fabricating a semiconductor device illustrated in FIG. 1 will be described below. FIGS. 2 to 11 illustrate main steps of the process of fabricating the semiconductor device according to the first exemplary embodiment.

Figure 2:
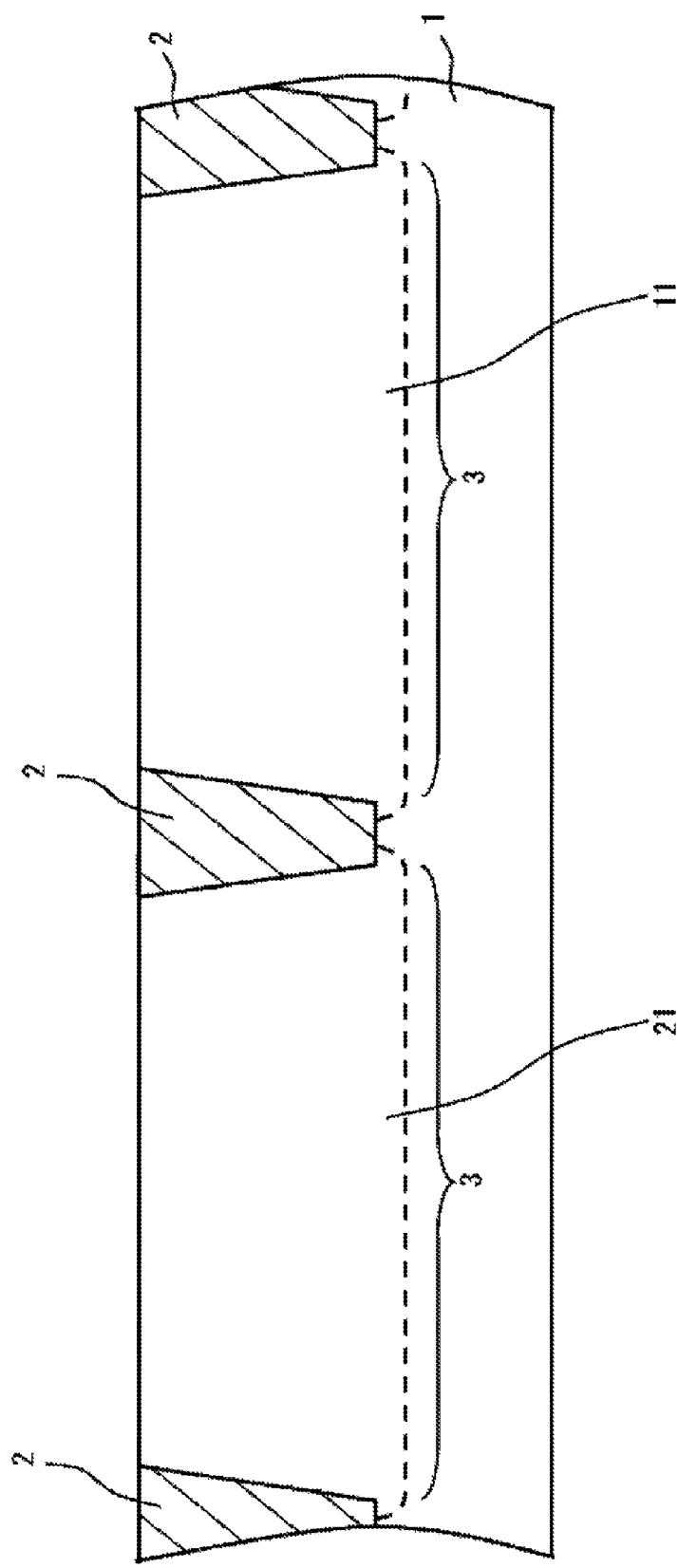
FIG. 2 is a diagram (1/10) illustrating a process of fabricating a semiconductor device according to the first exemplary embodiment.

In this step, STIs 2 that isolate element formation regions 3 are formed in a silicon substrate 1 as shown in FIG. 2. The silicon substrate 1 is a p-type silicon substrate doped with a small amount of a p-type impurity such as boron (B). Then, well regions 11, 21 are formed in the silicon substrate 1 in which the STIs 2 were formed. A p-type impurity such as boron (B) is implanted into the well region 11 and an n-type impurity such as phosphorus (P) or arsenic (As) is implanted into the well region 21. N-channel MOS transistor will be formed in the element formation region 3 in which the p-well region 11 was thus formed and p-channel MOS transistors will formed in the element formation region 3 in which the n-well region 21 was formed.

Figure 3:
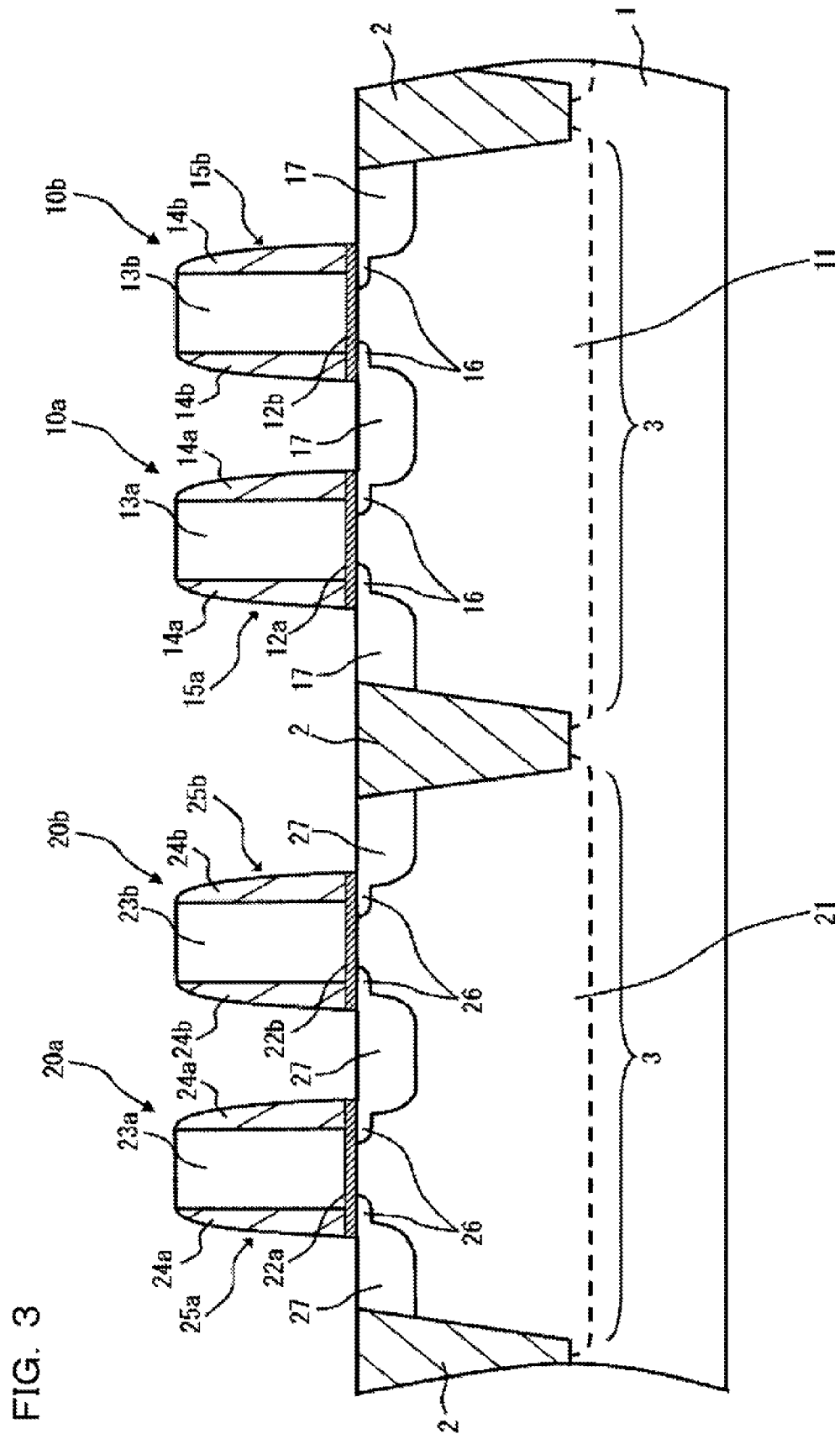
FIG. 3 is a diagram (2/10) illustrating the process of fabricating the semiconductor device according to the first exemplary embodiment.

In this step, the n-channel MOS transistors 10a, 10b and p-channel MOS transistors 20a, 20b are formed in the element formation regions 3 of the silicon substrate 1 in isolation from each other as shown in FIG. 3. The n-channel MOS transistors 10a, 10b and the p-channel MOS transistors 20a, 20b are formed by a conventional process as described below, for example. By forming the n-channel MOS transistors 10a, 10b and p-channel MOS transistors 20a, 20b side by side, a basic Complementary Metal Oxide Semiconductor (CMOS) structure, for example, is formed.

First a silicon oxide film (not shown) is formed on the silicon substrate 1 in order to form gate insulating films 12a, 12b, 22a, 22b. Then, a polysilicon film (not shown) is formed by a method such as CVD in order to form gate electrodes 13a, 13b, 23a, 23b. The portions of the formed silicon oxide film and polysilicon film except the regions of the gate electrodes 13a, 13b, 23a, 23b are removed by photolithography or anisotropic etching. Then, sidewall films 14a 14b, 24a, and 24b are formed on the sidewalls of the gate electrodes 13a, 13b, 23a, and 23b, respectively.

The gate electrodes (13a, 13b, 23a, 23b) are 40 to 50 nm in width and approximately 100 nm in height, for example. Each of the sidewall films 14a, 14b, 24a, 24b is approximately 30 to 40 nm thick.

Concurrently with the formation of the gate electrodes 13a, 13b, 23a, 23b and the sidewall films 14a, 14b, 24a, 24b, extension regions 16, 26 and source-drain regions 17, 27 are formed.

In the region of the n-channel MOS transistors 10a, 10b, first the gate electrodes 13a, 13b are used as a mask to implant an n-type impurity to form extension regions 16. Then, the gate electrodes 15a, 15b having the sidewall films 14a, 14b formed are used as a mask to implant an n-type impurity to form source-drain regions 17. The n-type impurity may be arsenic (As), for example.

In the region of the p-channel MOS transistors 20a, 20b, first the gate electrodes 23a, 23b are used as a mask to implant a p-type impurity to form extension regions 26. Then, the gate electrodes 25a, 25b having the sidewall films 24a, 24b formed are used as a mask to implant a p-type impurity to form source-drain regions 27. The p-type impurity may be boron (B), for example.

Figure 4:
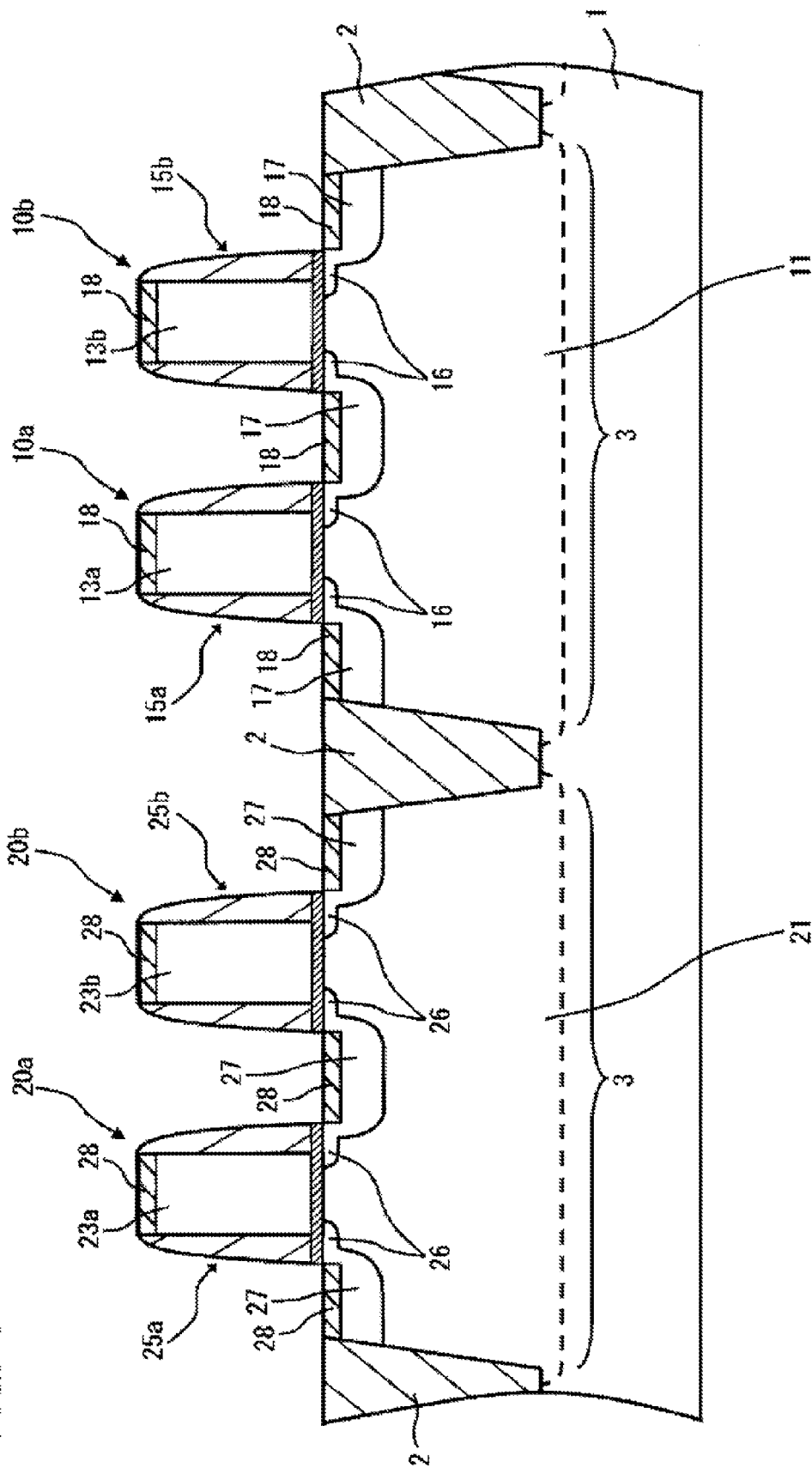
FIG. 4 is a diagram (3/10) illustrating the process of fabricating the semiconductor device according to the first exemplary embodiment.

In this step, silicide layers 18, 28 are formed on the surface of the gate electrodes 13a, 13b, 23a, 23b and on the surfaces of the source-drain regions 17, 27 as shown in FIG. 4.

Figure 5:
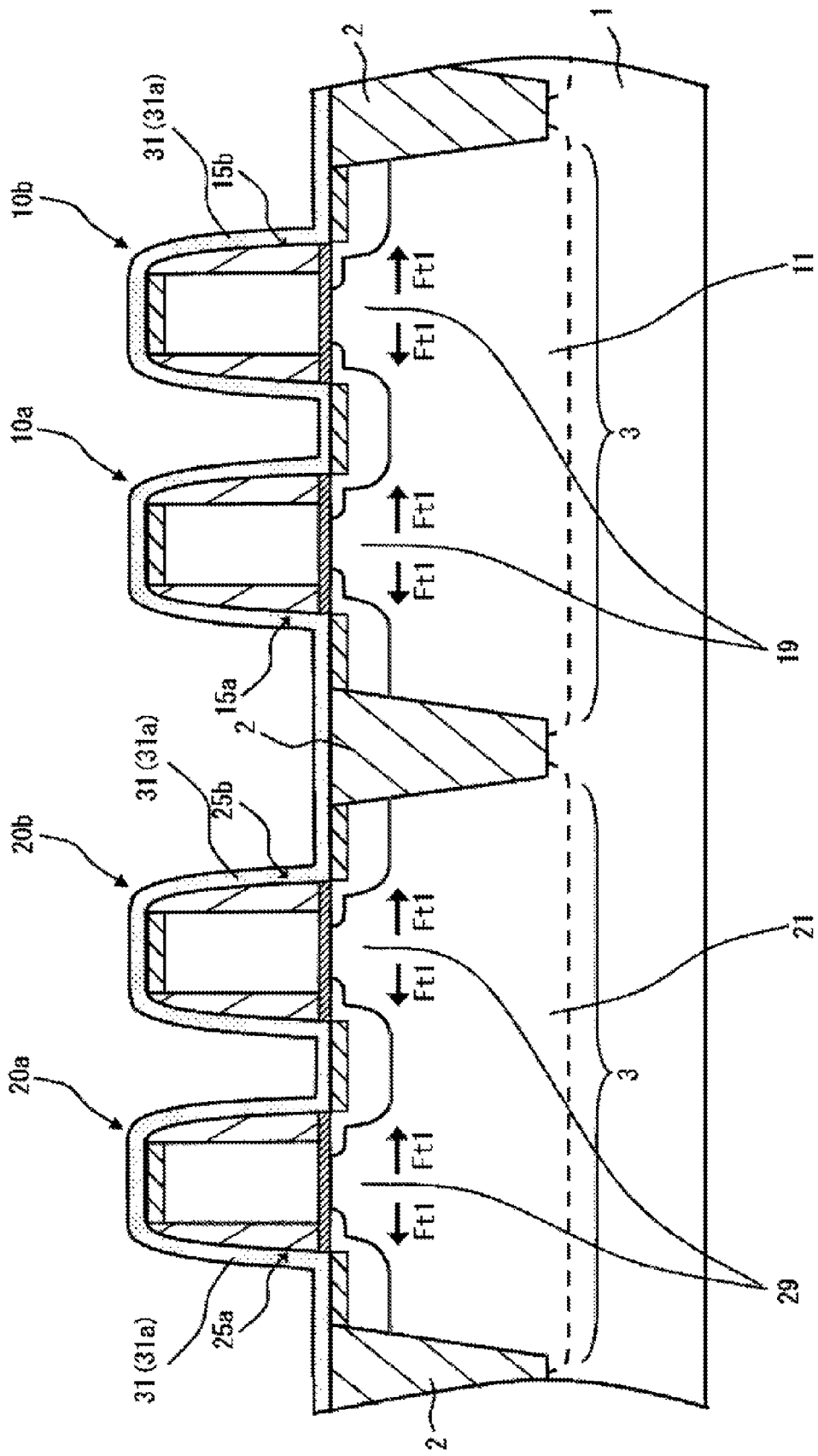
FIG. 5 is a diagram (4/10) illustrating the process of fabricating the semiconductor device according to the first exemplary embodiment.

In this step, a silicon nitride film (first insulating film) 31a is formed and is then shrunk to form a first stress film 31 as shown in FIG. 5. First a silicon nitride such as SiN or $Si_3N_4$ is deposited over the entire silicon substrate on which 15a, 15b, 25a, 25b were formed to form a silicon nitride film 31a (as-deposited film). The silicon nitride is deposited to a thickness in the range from 5 to 60 nm, for example, 23 nm, to form the silicon nitride film 31a. The silicon nitride film 31a is an insulating film of a material consisting primarily of silicon nitride.

A system used for depositing the silicon nitride on the silicon substrate 1 is a double parallel plate plasma enhanced CVD system (not shown). The gas for depositing the silicon nitride may be a mixed gas of silane (such as $SiH_4$, $SiH_2Cl_2$, $Si_2H_4$, or $Si_2H_6$) and ammonium ($NH_3$). The carrier gas used is a mixed gas of gases such as nitrogen ($N_2$), argon (Ar), and helium (He). The conditions in the plasma CVD system are set as follows.

Silane gas flow rate in the range from 5 to 50 sccm

Ammonium gas flow rate in the range from 500 to 10000 sccm

Carrier gas flow rate in the range from 500 to 10000 sccm

Deposition pressure in the range from 0.1 to 400 torr

Deposition temperature in the range from 200 to 450° C. (between or equal to 200 and 450° C.)

Here, it is desirable that the deposition of the silicon nitride films 31a is controlled to a thickness that does not form a discontinuous surface.

Then, the silicon substrate 1 is transferred from the plasma CVD system to a vacuum chamber (not shown), where the silicon substrate 1 on which the silicon nitride film 31a is formed is exposed to ultraviolet light (UV). The UV lamp used for UV exposure is a high-pressure mercury lamp which is commonly used. The atmosphere in the vacuum chamber may be a mixed gas of nitrogen, argon, and helium, for example. The conditions in the vacuum chamber are set as follows.

Chamber pressure in the range from 0.1 to 400 torr

UV lamp light intensity in the range from 50 to 1000 MW/cm$^2$

UV lamp exposure temperature in the range from 200 to 500° C. (between or equal to 200 and 500° C.)

UV lamp exposure time in the range from 1 to 30 minutes

The silicon nitride film 31a is exposed to UV under the conditions listed above to shrink the silicon nitride film 31a to form a first stress film 31 having a tensile stress in the range from approximately 1500 to approximately 2000 Mpa. The first stress film 31 induces a tensile stress Ft1 in the silicon crystals in the channel regions 19, 29 of the MOS transistors formed on the silicon substrate 1. Here, the thickness of the silicon nitride film 31a is reduced by 5 to 20% by volume by the UV exposure compared with that before the UV exposure.

Figure 6:
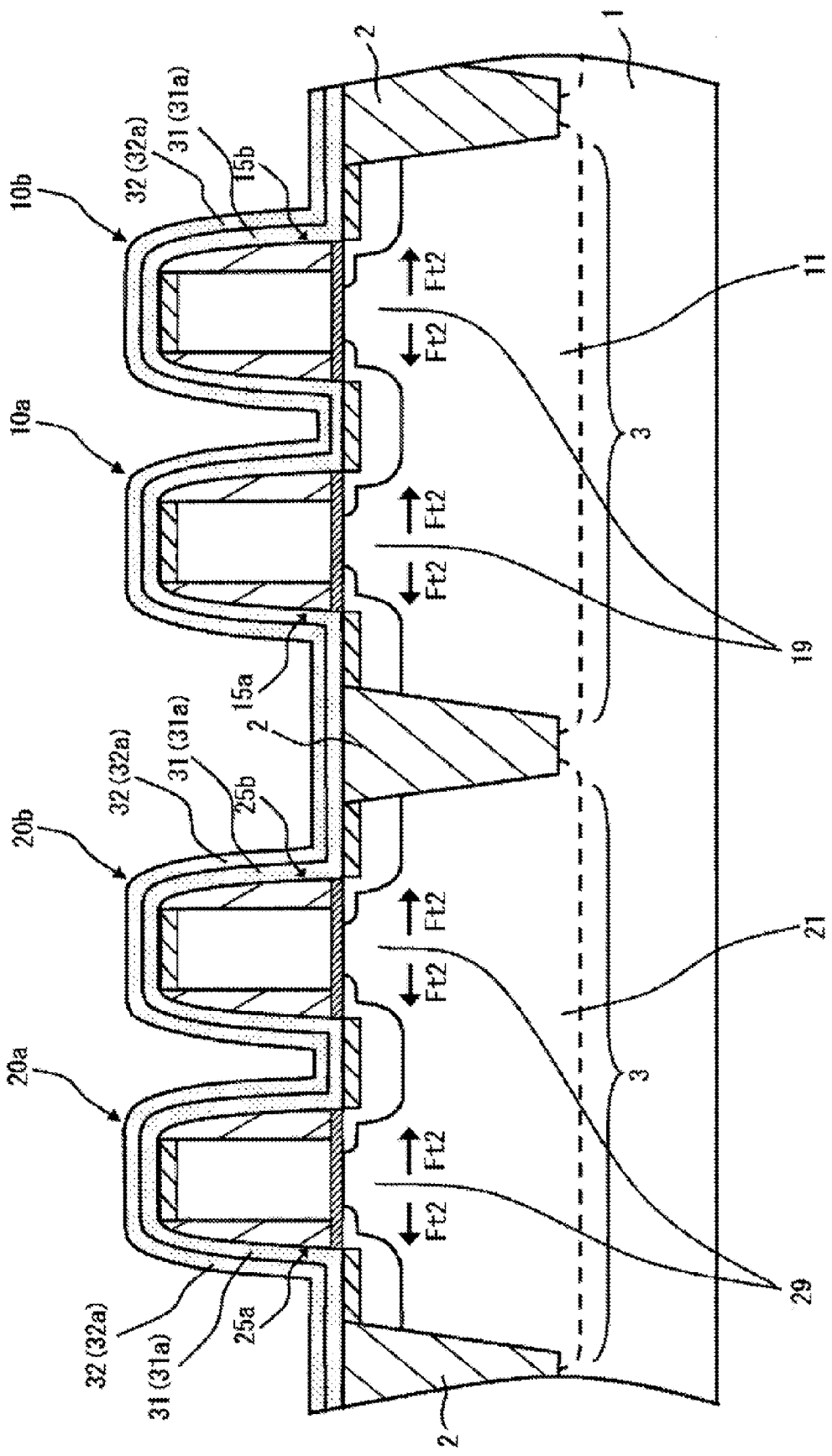
FIG. 6 is a diagram (5/10) illustrating the process of fabricating the semiconductor device according to the first exemplary embodiment.

In this step, the same processing as that in the fourth step is performed. A silicon nitride film (second insulating film) 32a is formed on the first stress film 31 and is then shrunk to form a second stress film 32 as shown in FIG. 6. The material and thickness of the silicon nitride film 32a are the same as or similar to those of the silicon nitride film 31a.

Like the first stress film 31, the second stress film 32 thus formed has a shrinkage force in the range from 1500 to 2000 Mpa and induces a tensile stress Ft2 in the channel regions 19, 29 of the MOS transistors formed on the silicon substrate 1.

Figure 7:
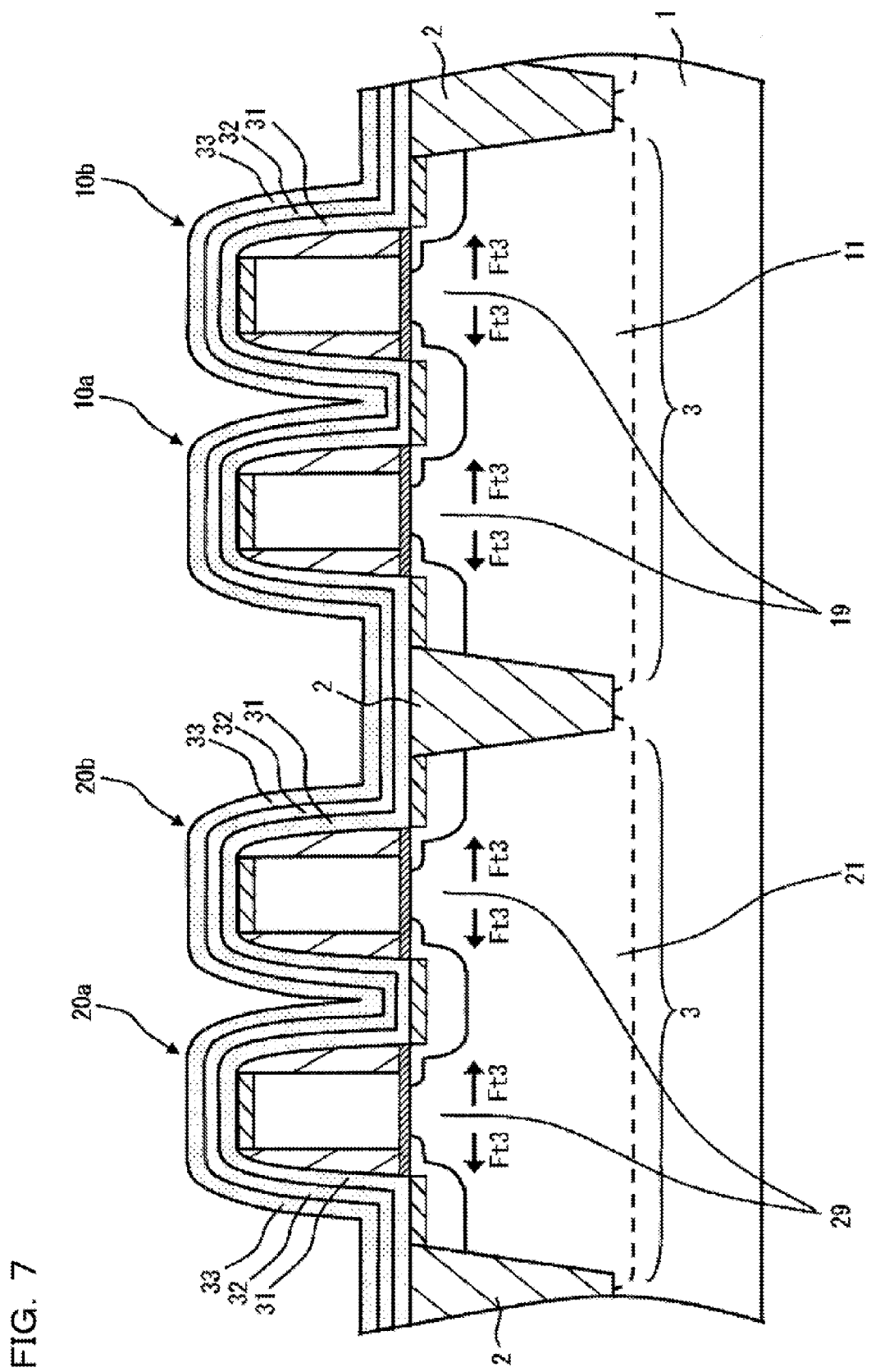
FIG. 7 is a diagram (6/10) illustrating the process of fabricating the semiconductor device according to the first exemplary embodiment.
Figure 8:
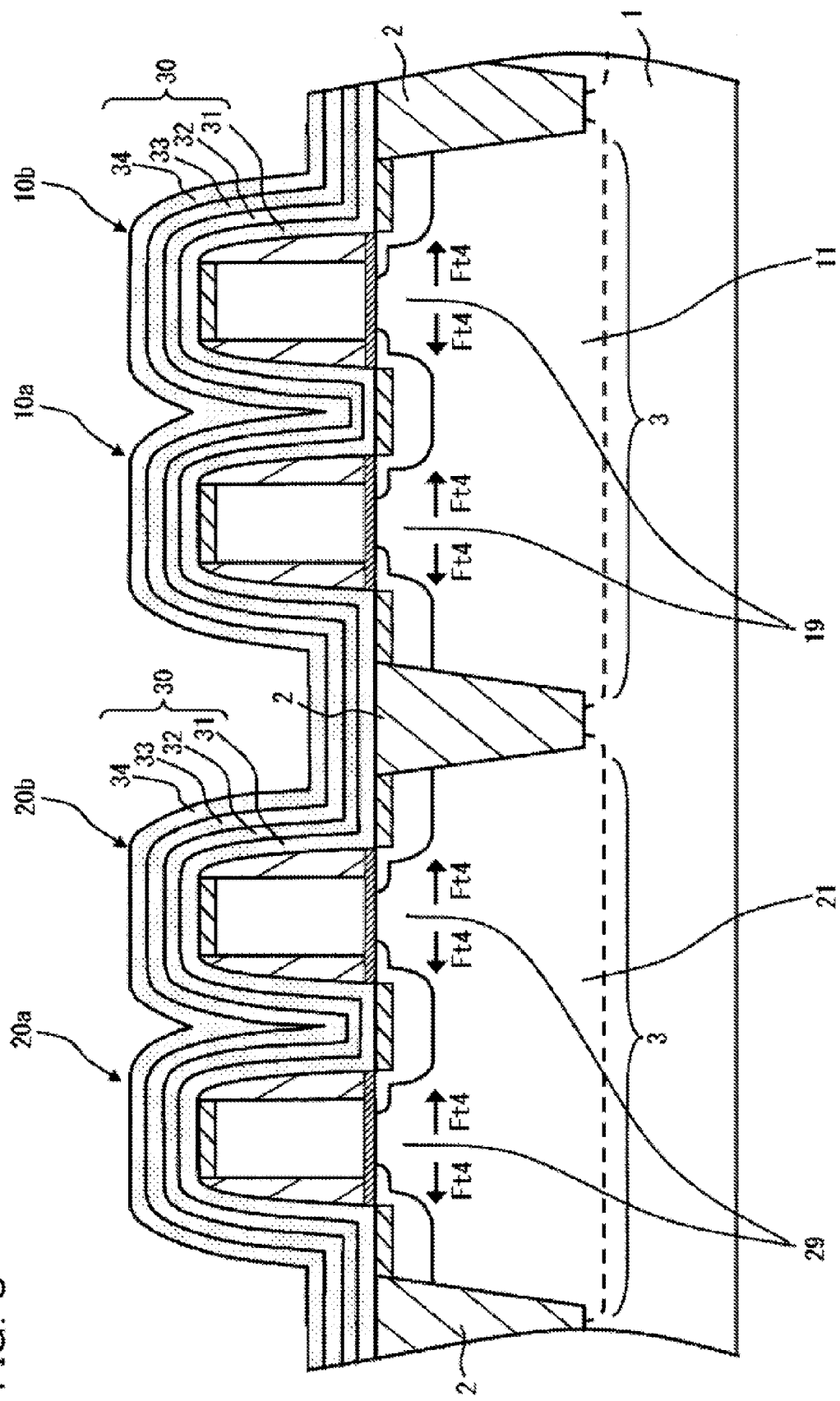
FIG. 8 is a diagram (7/10) illustrating the process of fabricating the semiconductor device according to the first exemplary embodiment.

In these steps, the same processing as that in the fifth step is performed twice to form third and fourth stress films 33 and 34 as illustrated in FIGS. 7 and 8. A shrinkage force of approximately 1500 to 2000 Mpa is generated in each of the third and fourth stress films 33 and 34 as in the first stress film. The shrinkage forces generated in the first to fourth stress films 31 to 32 act together on the silicon crystals in the channel regions 19, 29 of the MOS transistors formed on the silicon substrate 1 to induce a strong tensile stress Ft3 or Ft4 in the silicon crystals. The tensile stress that strains the silicon crystals in the silicon substrate 1 increases with increasing thickness of the stress film. Therefore, Ft<Ft2<Ft3<Ft4. The thickness of the third and fourth stress films 33 and 34 is reduced by 5 to 20% by UV exposure compared with that before the UV exposure.

In this way, the fourth step is repeated four times in total in the sequence of the fourth to seventh steps. As a result, a stress film 30 approximately 80 nm thick is formed on the silicon substrate 1 having the transistors (n-channel MOS transistors 10a, 10b and p-channel MOS transistors 20a, 20b) formed thereon.

Figure 14:
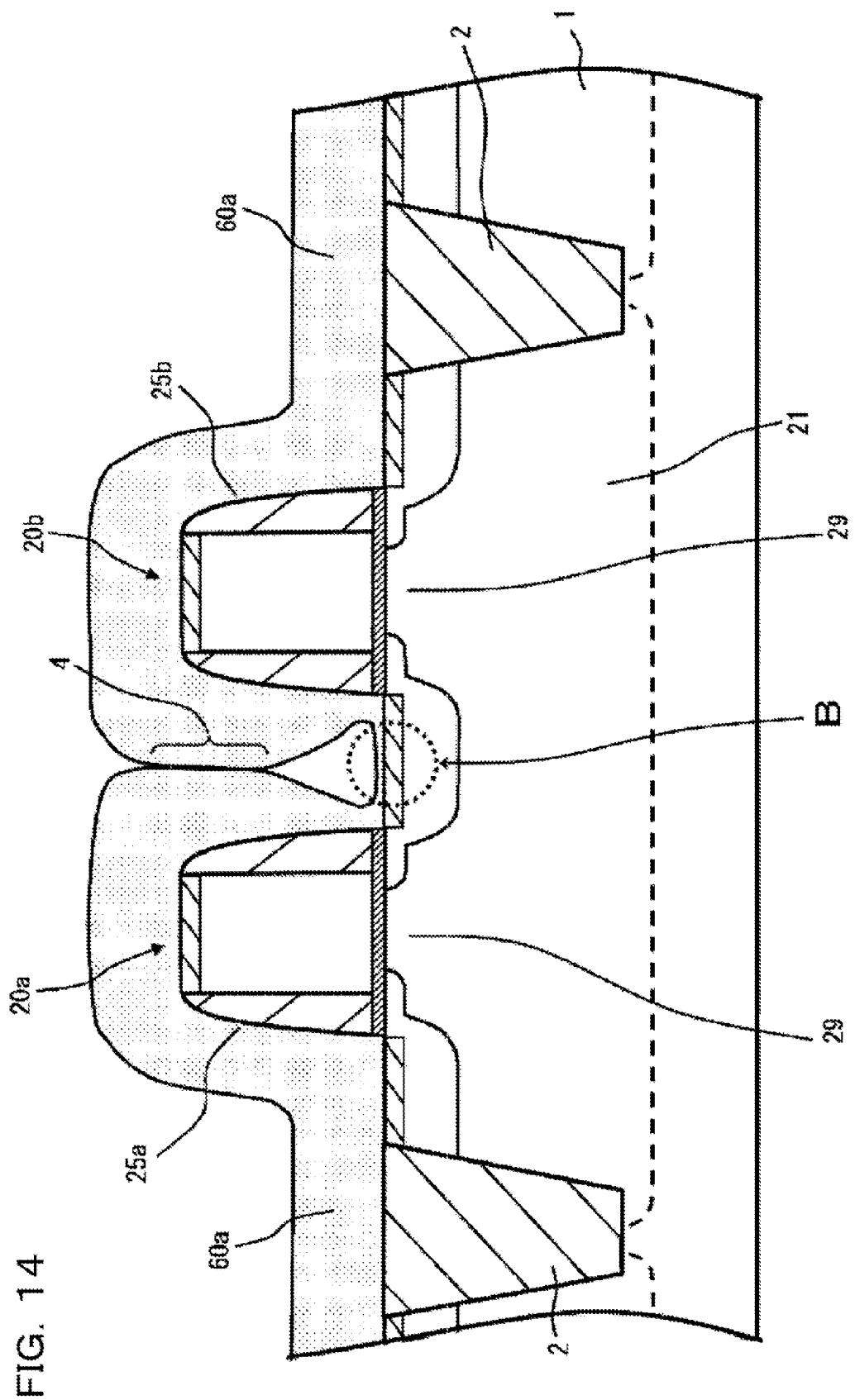
FIG. 14 is a cross-sectional view (3/4) illustrating the stress film formed by the conventional method.
Figure 15:
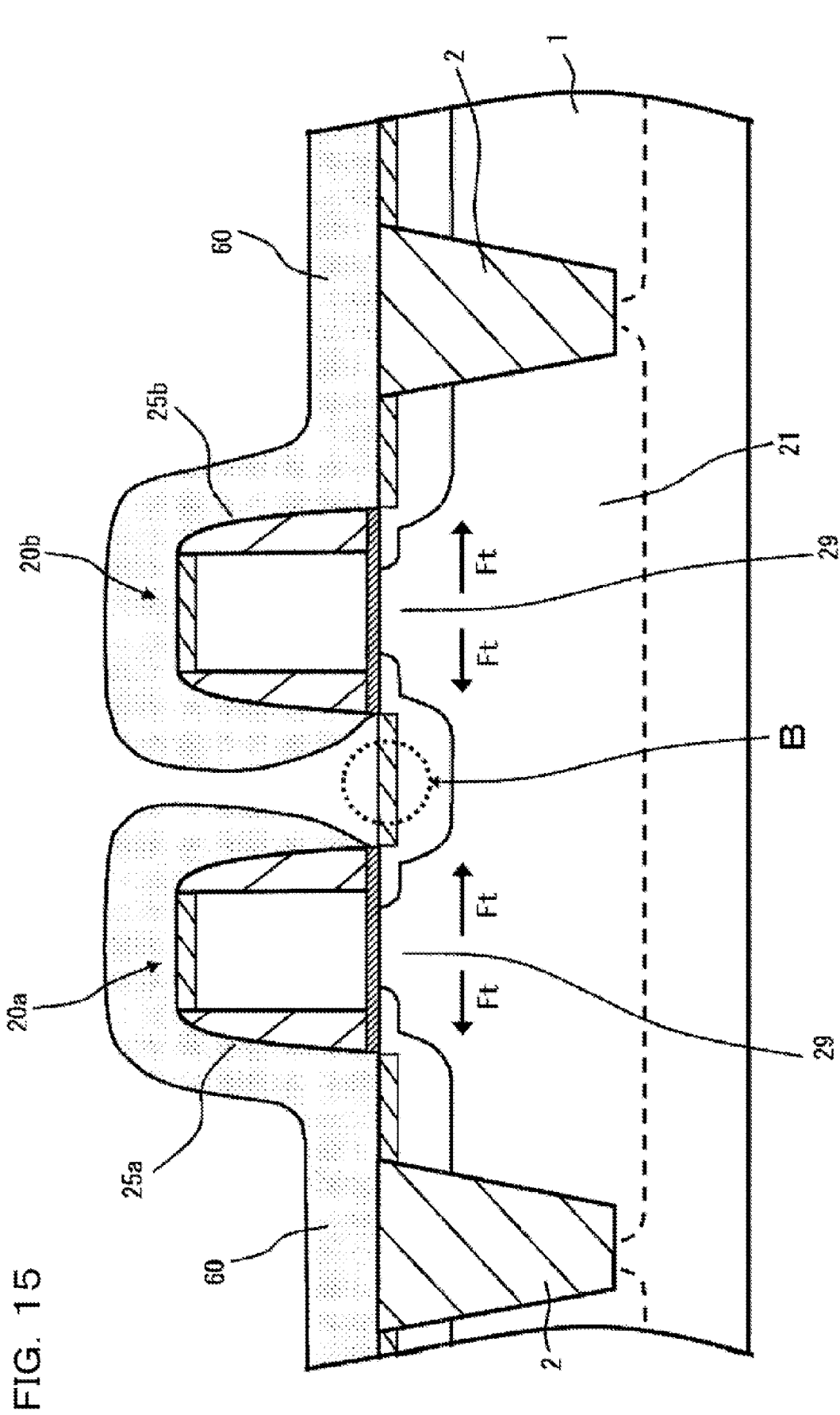
FIG. 15 is a cross-sectional view (4/4) illustrating the stress film formed by the conventional method.

In the present exemplary embodiment, a plurality of silicon nitride films having tensile stresses are formed in multiple steps as described above. Each silicon nitride film is deposited and then exposed to UV to shrink the film in each film forming step. Since the multilayered silicon nitride film is deposited in multiple steps, each silicon nitride film is deposited to a small thickness in each deposition step. Furthermore, since each silicon nitride film is shrunk by UV exposure to increase the gap before the next silicon nitride film is deposited, generation of a void as shown in FIG. 14 may be inhibited. In the present exemplary embodiment, if a discontinuous surface is generated in the fourth deposition step, generation of a crack in the silicon nitride film may be inhibited because the discontinuous line (of the discontinuous surface from a lateral view) will be shorter and the amount of shrinkage of the silicon nitride film by UV exposure will be smaller than in the conventional method in which the stress film is deposited in a single deposition step.

In order to transmit the force of the multilayered stress film 30 that strains silicon crystals to the silicon substrate 1, the first stress film 31 may be formed in contact with the silicon substrate 1.

It is also preferable that stress films formed nearer to the transistors are thinner than stress films formed farther from the transistors. Preferably, the stress film disposed closest to the transistors is thinner than the other stress films. The first stress film 31 may be the thinnest. If a stress film is formed so that these conditions are met, a silicon nitride film, immediately after the silicon nitride is deposited, that is, at the time the silicon nitride film has been formed, does not tend to form a discontinuous surface. Consequently, breaks in the stress film that would otherwise occur during shrinkage may be reliably inhibited.

Figure 9:
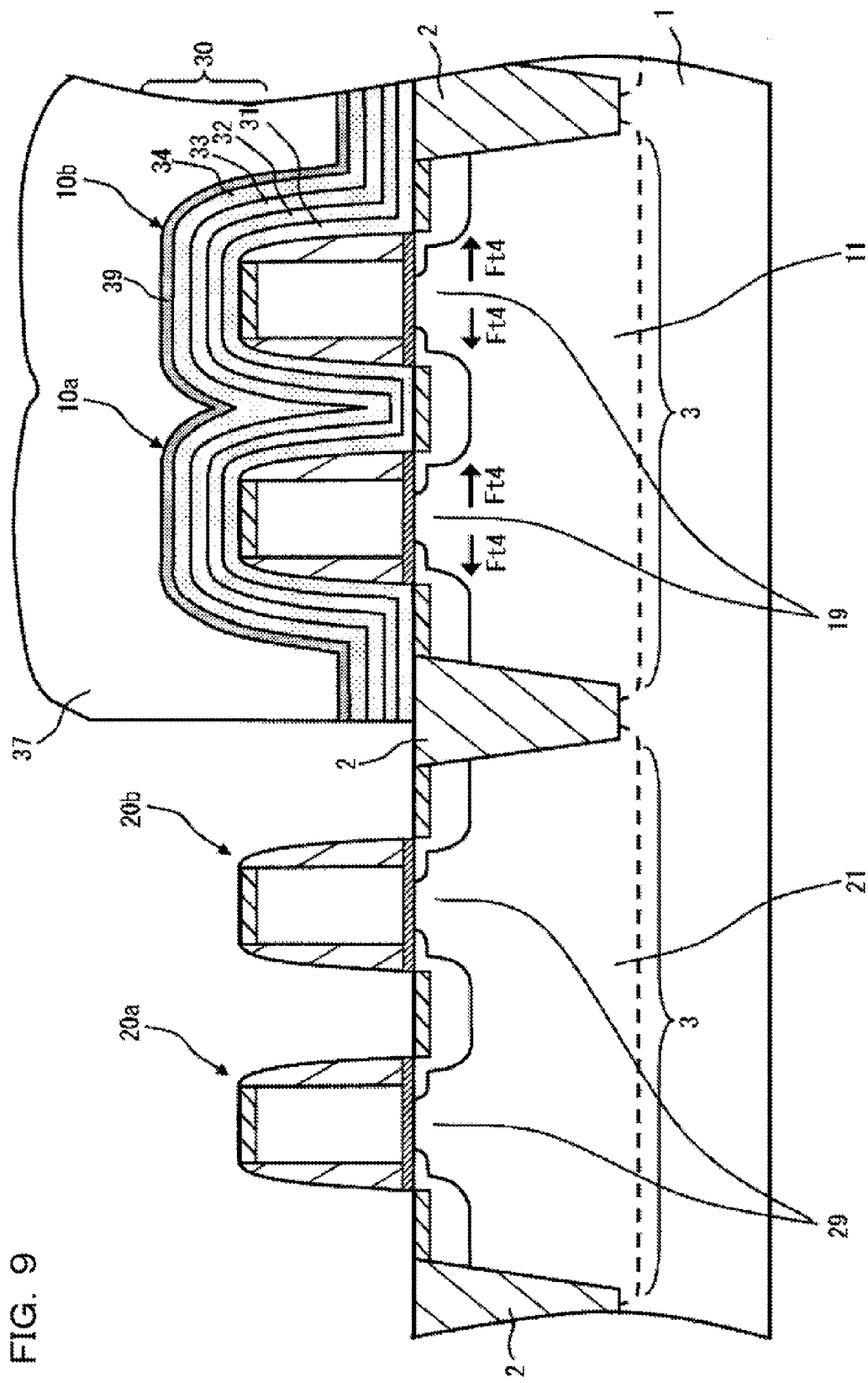
FIG. 9 is a diagram (8/10) illustrating the process of fabricating the semiconductor device according to the first exemplary embodiment.

In this step, the stress film 30 is removed from the regions in which the p-channel MOS transistors 20a, 20b are formed, as shown in FIG. 9. First an insulating film 39 which acts as an etch stopper is formed on the stress film 30. The insulating film 39 may be a plasma TetraEthOxySilane (TEOS) film having a thickness of 25 nm, for example. Then, a photoresist 37 is formed on the insulating film 39 and is then patterned so that the photoresist 37 in the regions where the n-channel MOS transistors 10a, 10b are formed is left. Then, etching or other process is performed to remove the stress film 30 from the regions where the p-channel MOS transistors 20a, 20b are formed.

Figure 10:
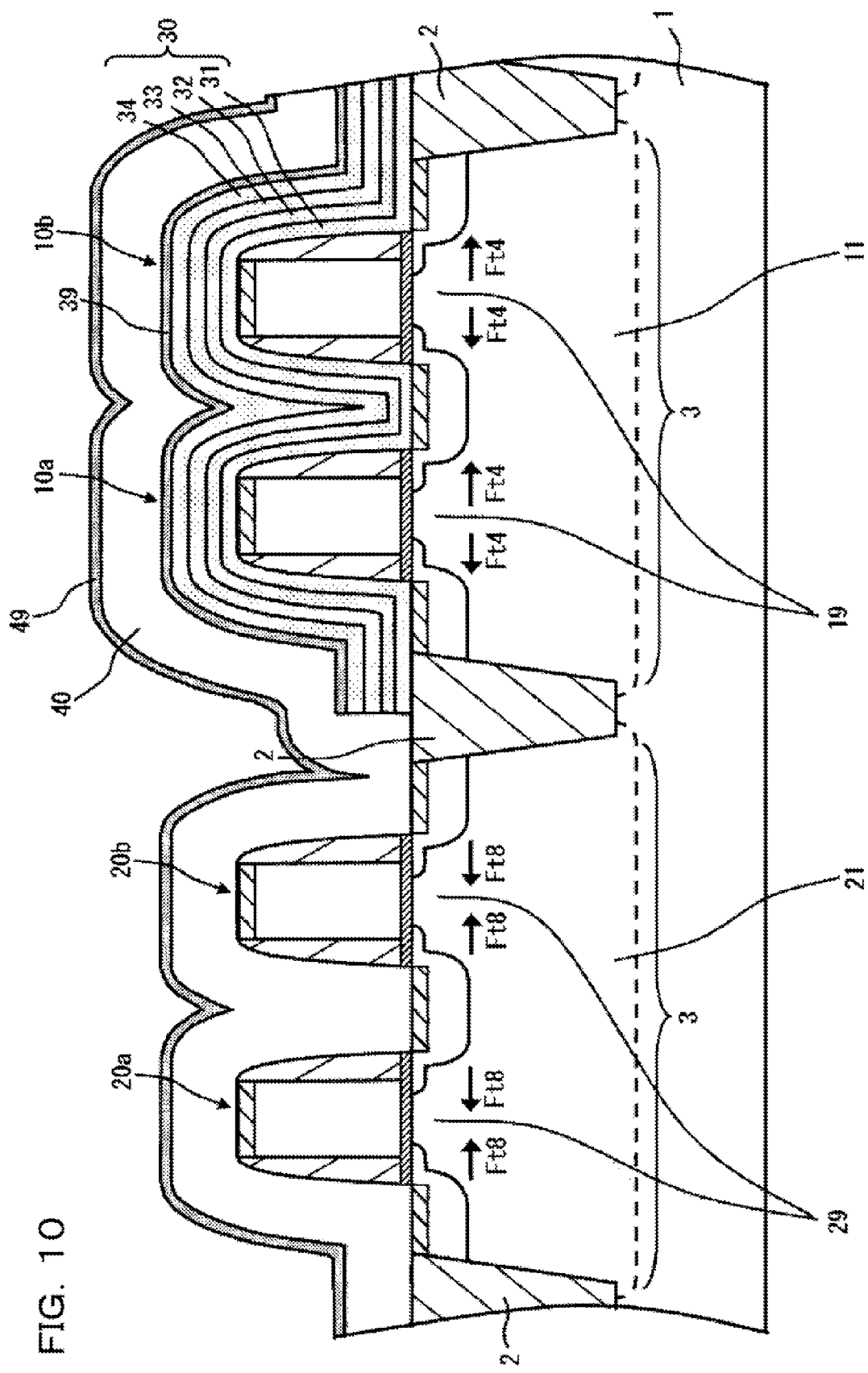
FIG. 10 is a diagram (9/10) illustrating the process of fabricating the semiconductor device according to the first exemplary embodiment.

In this step, a stress film (fifth stress film) 40 and an insulating film 49 which acts as an etch stopper are formed on the insulating film 39 formed on the silicon substrate 1, as shown in FIG. 10. A silicon nitride containing carbon (C) is deposited on the insulating film 39 by plasma CVD, for example, to form a stress film 40. The gas used in the plasma CVD may be a mixed gas of silane ($SiH_4$), ammonium ($NH_3$), and carbon, for example. The stress film 40 is a silicon nitride film made of a material that consists primarily of a silicon nitride and contains carbon, for example. The silicon nitride film containing carbon induces a compressive stress Ft8 in the silicon crystals in the channel regions 29 of the MOS transistors during formation of the silicon nitride film. Then, an insulating film 49 which acts as an etch stopper is formed on the stress film 40. The insulating film 49 may be a plasma TEOS film having a thickness of 25 nm, for example.

Figure 11:
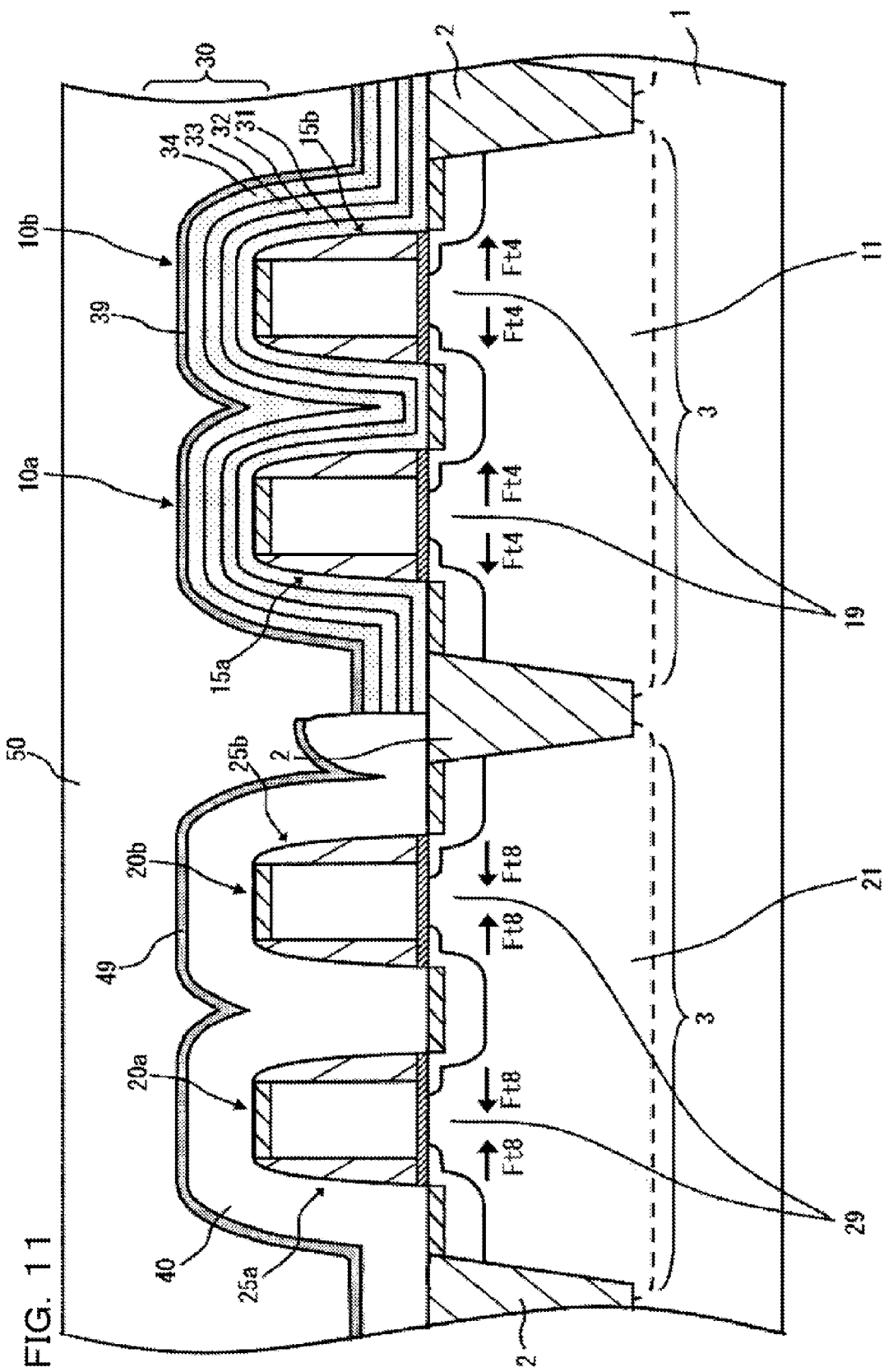
FIG. 11 is a diagram (10/10) illustrating the process of fabricating the semiconductor device according to the first exemplary embodiment.
Figure 12:
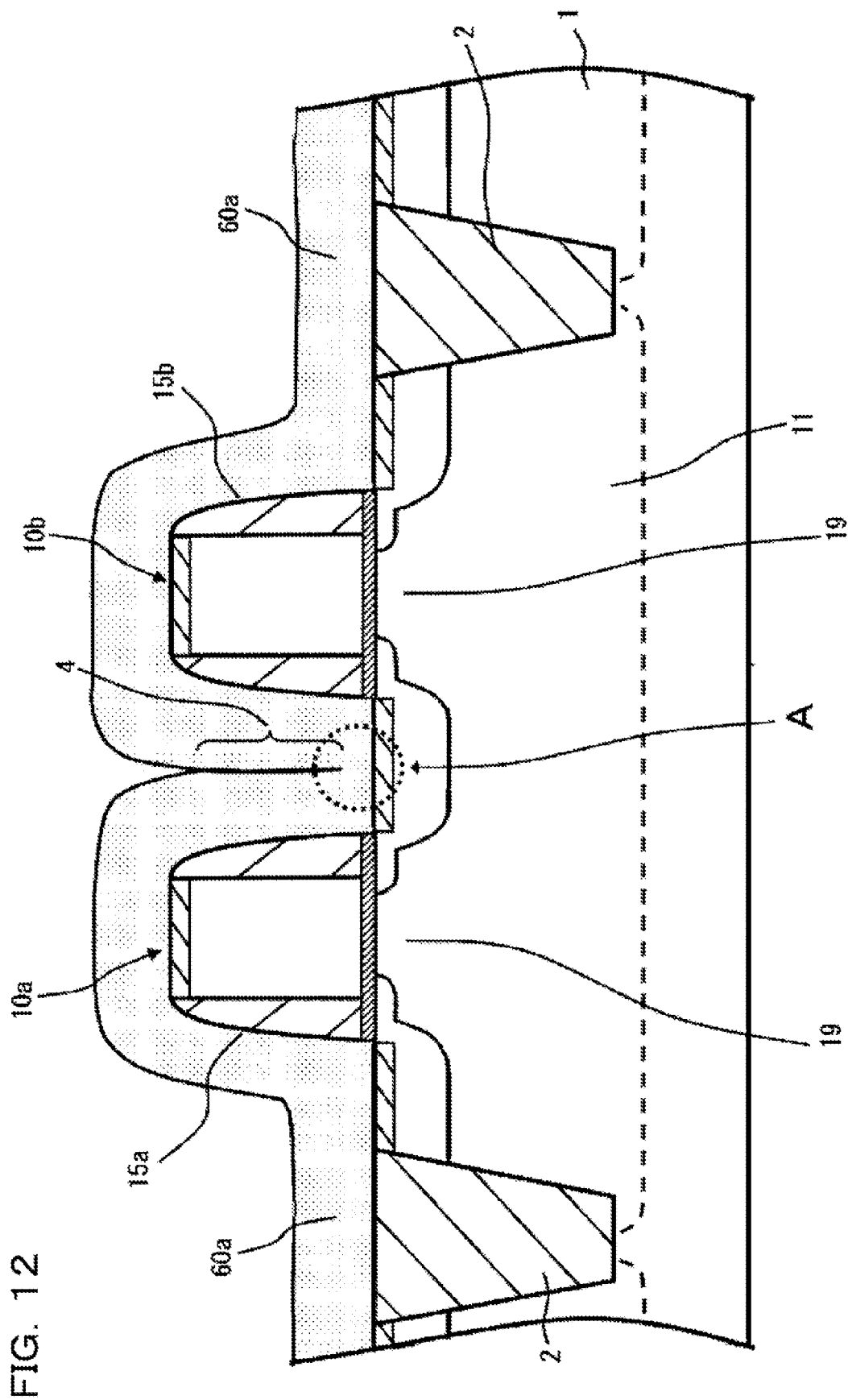
FIG. 12 is a cross-sectional view (1/4) illustrating a stress film formed by a conventional method.
Figure 13:
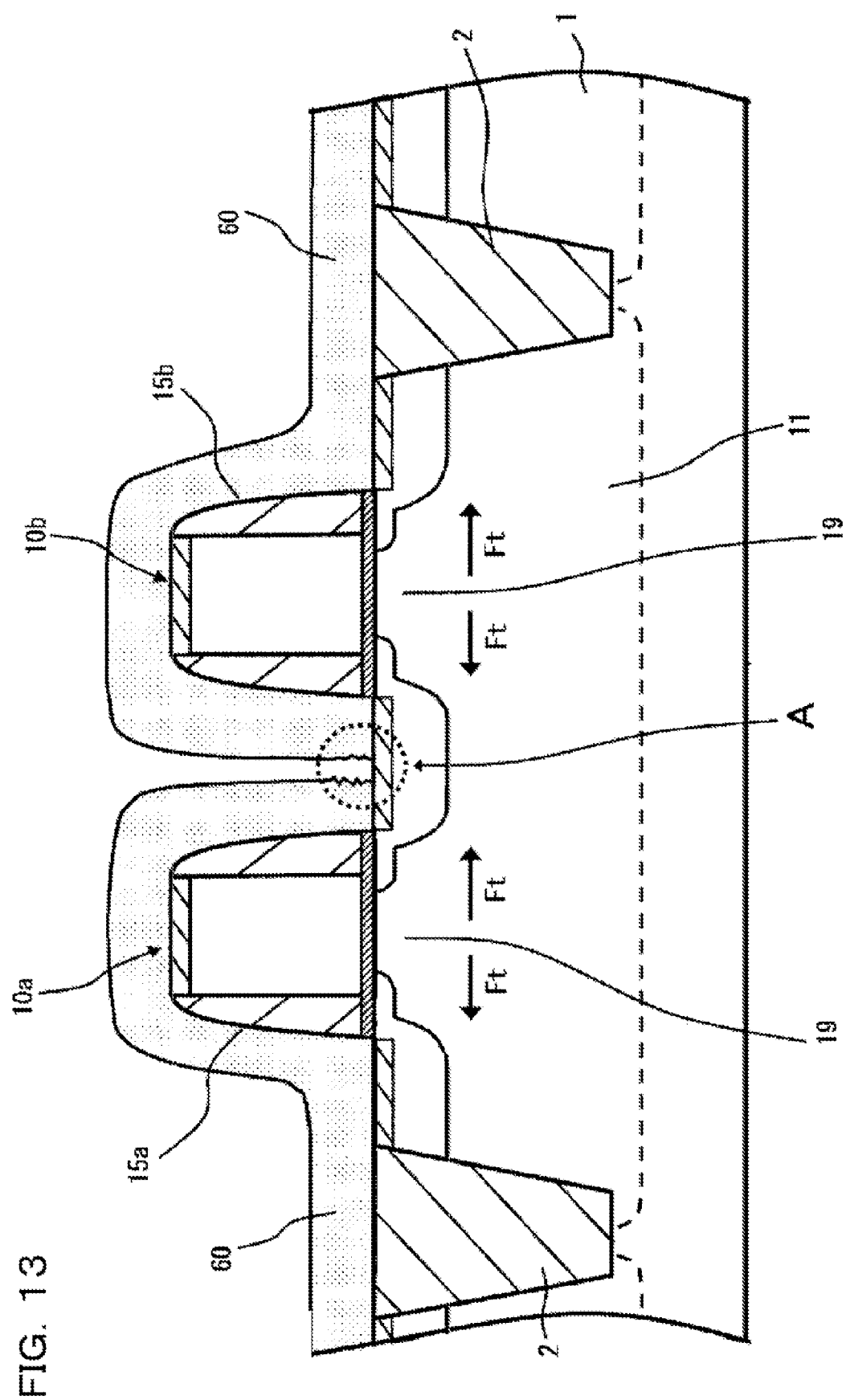
FIG. 13 is a cross-sectional view (2/4) illustrating the stress film formed by the conventional method.

In this step, the stress film 40 and the insulating film 49 are removed from the regions where the n-channel MOS transistors 10a, 10b are formed and an interlayer insulating film 50 is formed, as shown in FIG. 11. First a photoresist, not shown, is formed in the regions where the p-channel MOS transistors 20a, 20b are formed. Then, the photoresist is patterned so that the photoresist is left in the regions where the p-channel MOS transistors 20a, 20b are formed. Then, etching or other process is performed to remove the stress film 40 and the insulating film 49 from the regions where the n-channel MOS transistors 10a, 10b are formed. By using CVD, for example, an interlayer insulating film 50 is formed on the substrate 1 on which the stress film 30, the insulating film 39, the stress film 40 and the insulating film 49 have been formed. The interlayer insulating film 50 is made of a material such as $SiO_2$.

In this way, n-channel MOS transistors 10a, 10b and p-channel MOS transistors 20a, 20b are formed on a silicon substrate 1 in the present exemplary embodiment and then a silicon nitride film (first insulating film) 31a covering these transistors is formed. Then, the silicon nitride film 31a is shrunk by UV exposure to form a first stress film 31. A silicon nitride film (second insulating film) 32a is formed on the first stress film 31 and is shrunk by UV exposure to form a second stress film 32. The process is repeated to form third and fourth stress films 33 and 34 on the second stress film 2. Then the stress films 31 to 34 are removed from the regions where the p-channel MOS transistors 20a, 20b are formed and then the fifth stress film 40 is formed in the region.

The structure has the following advantageous effects.

(1) The structure inhibits breakages in the stress film 30 in the regions where the n-channel MOS transistors 10a, 10b are formed and may apply a strong tensile stress to the channel regions of the n-channel MOS transistors 10a, 10b.

(2) The structure inhibits damage to the surface in the regions of the silicon substrate where the p-channel MOS transistors 20a, 20b are formed.

The present exemplary embodiment may inhibit breaks in the stress film 30 because a stress film (first stress film 31) thinner than the entire stress film (the first to fourth stress films 31 to 34) is formed first. Because the film (for example a silicon nitride film 31a) for forming the stress film is thin, a discontinuous surface 4 is less likely to be caused in the film formed in the region between adjacent gates, as shown in FIG. 5. Since the shrinking process is applied to the film in this state, a large impact is not caused during the shrinkage and breaks in the stress film are avoided. In addition, stress film layers added subsequently ensure a sufficient thickness of the stress film and provide a high tensile stress.

A variation of the first exemplary embodiment will be described. The variation is an example in which, instead of UV exposure, plasma exposure is used in the step of shrinking a silicon nitride film or plasma exposure is performed in addition to UV exposure. If plasma exposure is performed in addition to UV exposure, any of the plasma exposure and UV exposure may be performed first. The effect of shrinking a silicon nitride film is provided irrespective of which of them is performed first. Plasma exposure is believed to have the effect of discharging hydrogen (H) from a nitride film. In the present exemplary embodiment, plasma exposure is used as assistance in shrinking films by UV exposure. In the second exemplary embodiment, plasma exposure is performed before UV exposure in the fourth to seventh steps of the first exemplary embodiment. The rest of the second exemplary embodiment is the same as the first exemplary embodiment.

For the plasma exposure, the plasma CVD system for CVD process in the first exemplary embodiment may be used. The plasma used may be nitrogen plasma, hydrogen plasma, or ammonium plasma. A deposited silicon nitride film is exposed to a nitrogen plasma, a hydrogen plasma, or an ammonium plasma to shrink the silicon nitride film. The types of plasmas are not limited to the examples enumerated above.

The conditions in the plasma CVD system for the plasma exposure are set as follows, for example.

Flow rate of carrier gas such as nitrogen or ammonium in the range from 500 to 10000 sccm Deposition pressure in the range from 0.1 to 400 torr The silicon nitride film exposed to the plasma is then exposed to UV.

The plasma exposure also acts on a silicon nitride film shrunk by UV exposure, thereby further shrinking the silicon nitride film. For example, plasma exposure of a deposited silicon nitride film 32a also acts on a stress film 31 already shrunk by UV exposure and further shrinks the thickness of the stress film 31.

The plasma exposure increases the amount of shrinkage of a silicon nitride film as compared with the first exemplary embodiment. The increase in the amount of shrinkage reduces the thickness of the stress film. As a result, a silicon nitride film subsequently deposited becomes less likely to form a break surface and the stress film becomes less prone to breaks. The plasma exposure may be performed in the same system used for depositing the silicon nitride films and therefore may be simply performed. The plasma exposure performed before UV exposure may improve the effect of inhibiting breaks in the stress film while at the same time providing a high tensile stress.

Results of examinations conducted on semiconductor devices fabricated by methods according to the first and second embodiments and a method of a comparative example to examine the crack generation rates will be given below. In the comparative example, the method illustrated in FIGS. 12 to 15 was used to fabricate a semiconductor device having a stress film 60.

First, the method according to the first exemplary embodiment was used to fabricate a semiconductor device including a stress film 30 (the structure illustrated in FIG. 8) by performing film deposition on a silicon wafer and UV exposure four times. Then, CVD was used to deposit a plasma TEOS film as an interlayer insulating film to a thickness of 25 nm on the stress film 30 formed.

Photolithography and etching were performed to remove the interlayer insulating film from the regions of the p-channel MOS transistors 20a, 20b. The resulting silicon wafer was observed under an SEM (Scanning Electron Microscope) and cross-sections of the silicon wafer were observed under TEM (Transmission Electron Microscope). The entire silicon wafer was observed in this way. The observations have not shown breaks in the stress film formed by the method of the first exemplary embodiment. The observations also have not shown any cracks in the STIs 2 of the silicon substrate 1.

Then, a stress film 30 was formed by the fabrication method of the second exemplary embodiment and the semiconductor device in which the stress film 30 was formed was observed by the same method described above. The observations have not shown any breaks or cracks.

Then, a stress film 60 was formed by the method of the comparative example and was observed by the same method described above. The observations have shown breaks in the stress film 60 and cracks in the STIs 2 of the silicon substrate 1. The observations have shown that breaks and cracks appear in regions of the pattern where successive gate electrode structures are formed at intervals of approximately 100 nm. More specifically, the breaks and cracks were observed in the regions between and around gates of the gate electrode structures near the surface of the silicon wafer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a first element region where n-channel field-effect transistors are formed;
   a second element region where p-channel field-effect transistors are formed adjacent to the first element region;
   a first stress film formed to cover the n-channel field-effect transistors above the first element region, the first stress film applying a strain to channel regions of the n-channel field-effect transistors;
   a second stress film formed on the first stress film above the first element region, the second stress film applying a strain to the channel regions of the field-effect transistors;
   a third stress film formed on the second stress film above the first element region, the third stress film applying a strain to the channel regions of the field-effect transistors; and
   a fourth stress film formed to cover the p-channel field-effect transistors above the second element region, the fourth stress film applying a strain to the channel regions of the p-channel field-effect transistors,
   wherein a number of stress films formed above the first element region is greater than a number of stress films formed above the second element region,
   wherein the first stress film is thinner than the second stress film and the second stress film is thinner than the third stress film.

2. The semiconductor device according to claim 1, further comprising:
   a fifth stress film formed on the third stress film, the fifth stress film applying a strain to the channel regions of the field-effect transistors.

3. The semiconductor device according to claim 1, further comprising:
   a fifth stress film formed on the third stress film,
   wherein the third stress film is thinner than the fourth stress film.

4. The semiconductor device according to claim 1, wherein a thickness of the fourth stress film is substantially equal to a total thickness of the first stress film, the second stress film and the third stress film.

5. The semiconductor device according to claim 1, further comprising,
   an isolation region between the first element region and the second element region,
   wherein there is a dislocation between the fourth stress film and three stress films including the first stress film, the second stress film and the third stress film above the isolation region.

6. The semiconductor device according to claim 1, further comprising,
   an isolation region between the first element region and the second element region,
   wherein the fourth stress film is not provided continuously in the direction of the first element region above the isolation region.

7. A semiconductor device, comprising:
   a first element region where n-channel field-effect transistors are formed;
   a second element region where p-channel field-effect transistors are formed adjacent to the first element region;
   an isolation region between the first element region and the second element region;
   a first stress film formed to cover the n-channel field-effect transistors above the first element region, the first stress film applying a strain to channel regions of the n-channel field-effect transistors;
   a second stress film formed on the first stress film above the first element region, the second stress film applying a strain to the channel regions of the field-effect transistors;
   a third stress film formed on the second stress film above the first element region, the third stress film applying a strain to the channel regions of the field-effect transistors; and
   a fourth stress film formed to cover the p-channel field-effect transistors above the second element region, the fourth stress film applying a strain to the channel regions of the p-channel field-effect transistors,
   wherein a number of stress films formed above the first element region is greater than a number of stress films formed above the second element region,
   wherein the fourth stress film is not provided continuously in the direction of the first element region above the isolation region.

8. The semiconductor device according to claim 7, wherein the first stress film, the second stress film, the third stress film and the fourth stress film are a silicon nitride film.

* * * * *